(12) United States Patent
Machida et al.

(10) Patent No.: US 11,646,382 B2
(45) Date of Patent: May 9, 2023

(54) JUNCTION BARRIER SCHOTTKY DIODE DEVICE AND METHOD FOR FABRICATING THE SAME

(71) Applicant: Taipei ANJET Corporation, Taipei (TW)

(72) Inventors: Nobuo Machida, Kyoto (JP); Wen-Tsung Chang, Taipei (TW); Wen-Chin Wu, Taipei (TW)

(73) Assignee: TAIPEI ANJET CORPORATION, Taipei (TW)

( * ) Notice: Subject to any disclaimer, the term of this patent is extended or adjusted under 35 U.S.C. 154(b) by 3 days.

(21) Appl. No.: 17/317,100

(22) Filed: May 11, 2021

(65) Prior Publication Data

US 2022/0367731 A1 Nov. 17, 2022

(51) Int. Cl.
| | | |
|---|---|---|
| *H01L 21/00* | (2006.01) | |
| *H01L 29/872* | (2006.01) | |
| *H01L 29/47* | (2006.01) | |
| *H01L 21/285* | (2006.01) | |
| *H01L 21/443* | (2006.01) | |
| *H01L 29/66* | (2006.01) | |
| *H01L 29/16* | (2006.01) | |
| *H01L 29/20* | (2006.01) | |
| *H01L 29/24* | (2006.01) | |
| *H01L 21/04* | (2006.01) | |

(52) U.S. Cl.
CPC ........ *H01L 29/872* (2013.01); *H01L 21/0495* (2013.01); *H01L 21/28537* (2013.01); *H01L 21/28581* (2013.01); *H01L 21/443* (2013.01); *H01L 29/16* (2013.01); *H01L 29/1608* (2013.01); *H01L 29/2003* (2013.01); *H01L 29/24* (2013.01); *H01L 29/47* (2013.01); *H01L 29/475* (2013.01); *H01L 29/6606* (2013.01); *H01L 29/66143* (2013.01); *H01L 29/66212* (2013.01); *H01L 29/66969* (2013.01)

(58) Field of Classification Search
CPC ............... H01L 29/872; H01L 21/0495; H01L 21/28537; H01L 21/28581; H01L 21/443; H01L 29/16; H01L 29/1608; H01L 29/2003; H01L 29/24; H01L 29/47; H01L 29/475; H01L 29/6606; H01L 29/66143; H01L 29/66212; H01L 29/66969
See application file for complete search history.

(56) References Cited

U.S. PATENT DOCUMENTS

2016/0300960 A1* 10/2016 Miyake ................ H01L 29/872

* cited by examiner

*Primary Examiner* — Richard A Booth
(74) *Attorney, Agent, or Firm* — Muncy, Geissler, Olds & Lowe, P.C.

(57) ABSTRACT

A junction barrier Schottky diode device and a method for fabricating the same is disclosed. In the junction barrier Schottky device includes an N-type semiconductor layer, a plurality of first P-type doped areas, a plurality of second P-type doped areas, and a conductive metal layer. The first P-type doped areas and the second P-type doped are formed in the N-type semiconductor layer. The second P-type doped areas are self-alignedly formed above the first P-type doped areas. The spacing between every neighboring two of the second P-type doped areas is larger than the spacing between every neighboring two of the first P-type doped areas. The conductive metal layer, formed on the N-type semiconductor layer, covers the first P-type doped areas and the second P-type doped areas.

11 Claims, 18 Drawing Sheets

JUNCTION BARRIER SCHOTTKY DIODE DEVICE AND METHOD FOR FABRICATING THE SAME

BACKGROUND OF THE INVENTION

Field of the Invention

The present invention relates to a junction barrier Schottky diode device and a method for fabricating the same.

Description of the Related Art

Silicon carbide (SiC) has a wider bandgap than Silicon and much higher critical electric field. As a result, the breakdown voltage of the SiC device is higher than Silicon device. Although electron mobility of SiC is a bit lower than that of silicon, SiC power device has a higher overall performance than Silicon power device.

A Schottky barrier diode (i.e., SBD) includes a Schottky electrode, which contacts a semiconductor layer. An interface between the Schottky electrode and the semiconductor layer has a small work function generally for lowering forward voltage between metallic material composing the Schottky electrode and semiconductor material composing the semiconductor layer. Accordingly, when a reverse voltage is applied to the diode, a leak current in the SBD is larger than a PN junction type diode.

SBD is a majority carrier device. It means that SBD is a high speed device compared to PN diode which is a minority carrier device. As illustrated in FIG. 1, a junction barrier Schottky diode (JBS) has an advantage to SBD in the point of barrier effect by depletion region of PN junction formed by an N-type semiconductor layer 10 and a P-type doped area 11 in reverse bias condition. The N-type semiconductor layer 10 are formed by epitaxial growth on the N-type heavily doped substrate 8. And a metal layer 23 are formed on the N-type doped semiconductor layer 10 and the P-type doped area 11. This barrier effect can decrease the leakage current of SBD in reverse bias condition. But introducing PN junction reduces the effective SBD surface area and causes the higher electric resistance. This causes the higher forward voltage.

To overcome the abovementioned problems, the present invention provides a junction barrier Schottky diode device and a method for fabricating the same, so as to solve the afore-mentioned problems of the prior art.

SUMMARY OF THE INVENTION

The present invention provides a junction barrier Schottky diode device and a method for fabricating the same, which reduce the leakage current in a reverse bias condition and the forward voltage in a forward bias condition.

In an embodiment of the present invention, a junction barrier Schottky diode device includes an N-type semiconductor layer, a plurality of first P-type doped areas, a plurality of second P-type doped areas, and a conductive metal layer. The plurality of first P-type doped areas is formed in the N-type semiconductor layer. The plurality of second P-type doped areas is formed in the N-type semiconductor layer and self-alignedly formed above the plurality of first P-type doped areas. The spacing between every neighboring two of the plurality of second P-type doped areas is larger than the spacing between every neighboring two of the plurality of first P-type doped areas. The conductive metal layer, formed on the N-type semiconductor layer, covers the plurality of first P-type doped areas and the plurality of second P-type doped areas.

In an embodiment of the present invention, a method for fabricating a junction barrier Schottky diode device includes forming a first mask on an N-type semiconductor layer, wherein the first mask is penetrated with first openings; forming a plurality of first P-type doped areas in the N-type semiconductor layer through the first openings; respectively forming second masks in the first openings, wherein each of the second masks is penetrated with a second opening; forming a plurality of second P-type doped areas in the N-type semiconductor layer through the second openings of the second masks, wherein the plurality of second P-type doped areas is self-alignedly formed above the plurality of first P-type doped areas, and the spacing between every neighboring two of the plurality of second P-type doped areas is larger than the spacing between every neighboring two of the plurality of first P-type doped areas; removing the first mask and the second masks; and forming a conductive metal layer on the N-type semiconductor layer to cover the plurality of first P-type doped areas and the plurality of second P-type doped areas.

To sum up, the junction barrier Schottky diode device and the method for fabricating the same adjust the spacing between every neighboring two of the plurality of second P-type doped areas to be larger than the spacing between every neighboring two of the plurality of first P-type doped areas, thereby reducing the leakage current in a reverse bias condition and the forward voltage in a forward bias condition.

The narrower spacing between every neighboring two of the plurality of first P-type doped areas effectively shields the electric field in a reverse bias condition. And the wider spacing between every neighboring two of the plurality of second P-type doped areas realizes the wide Schottky diode area.

DETAILED DESCRIPTION OF THE INVENTION

Figure 1:
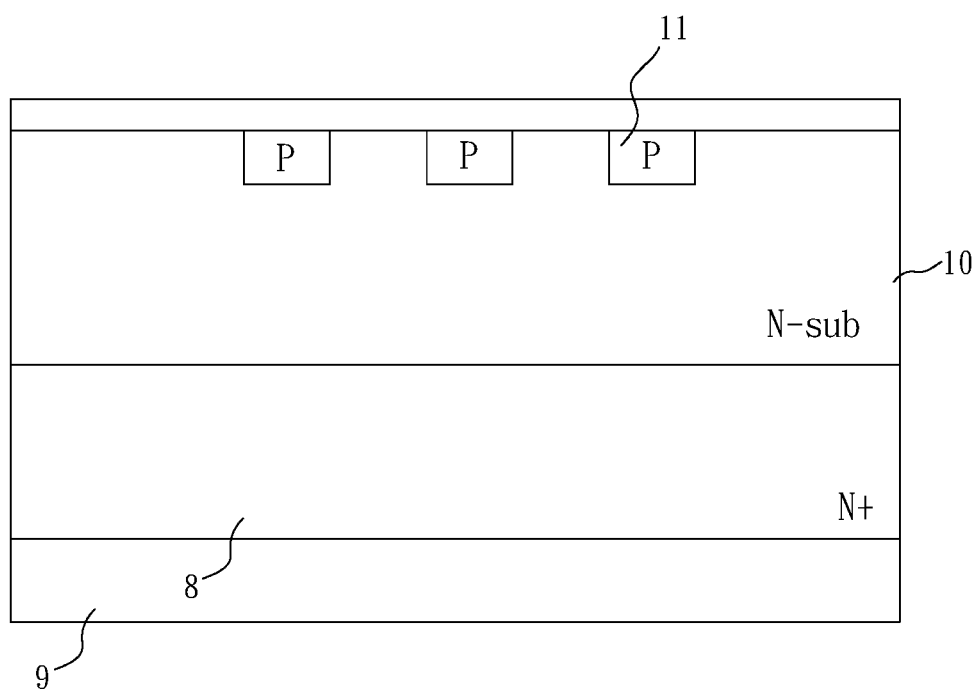
FIG. 1 is a diagram schematically illustrating a conventional junction barrier Schottky diode.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express that the embodiment in the invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

In the following description, a junction barrier Schottky diode device and a method for fabricating the same will be provided. In the junction barrier Schottky diode device, the spacing between every neighboring two of second P-type doped areas is larger than the spacing between every neighboring two of first P-type doped areas, thereby reducing the leakage current in a reverse bias condition and the forward voltage in a forward bias condition. The junction barrier Schottky diode device provided below may also be applied to other circuit configurations.

Figure 2:
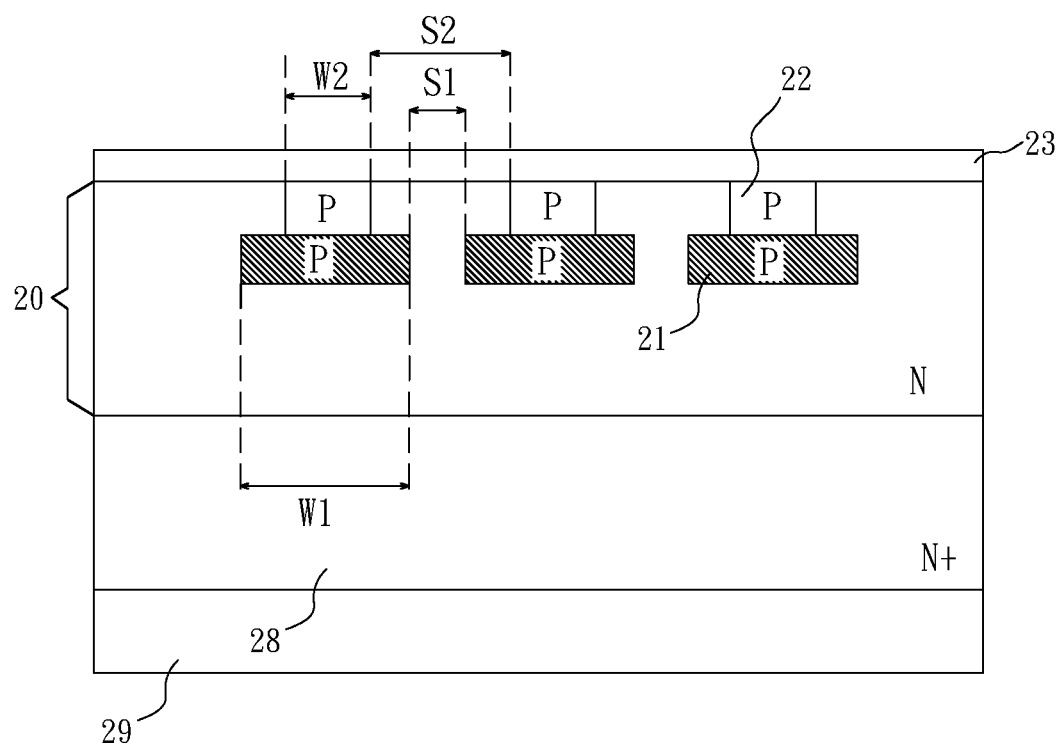
FIG. 2 is a diagram schematically illustrating a junction barrier Schottky diode device according to a first embodiment of the invention.
Figure 3A:
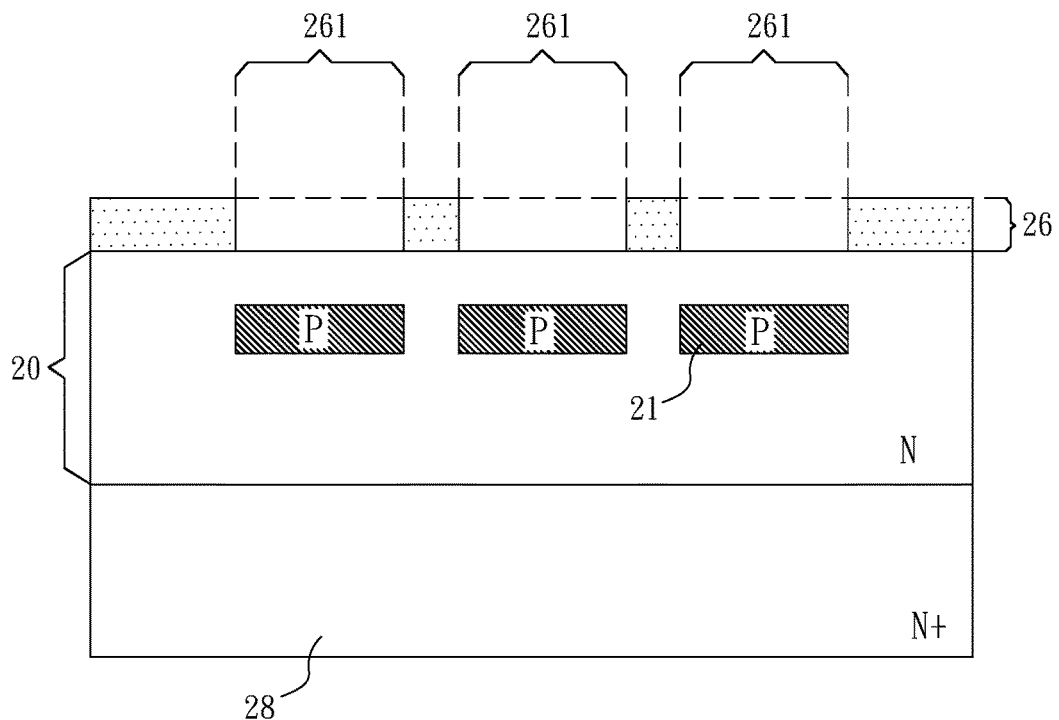
FIGS. 3(a)-3(d) are diagrams schematically illustrating the step of fabricating junction barrier Schottky diode device according to the first embodiment of the invention.
Figure 3B:
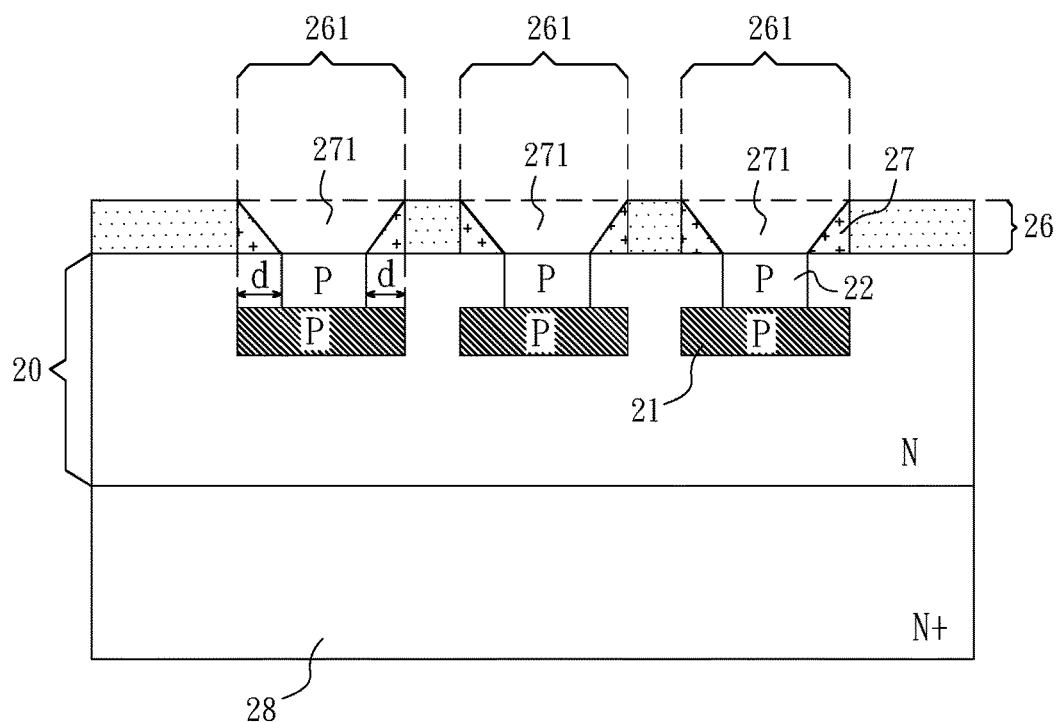
Figure 3C:
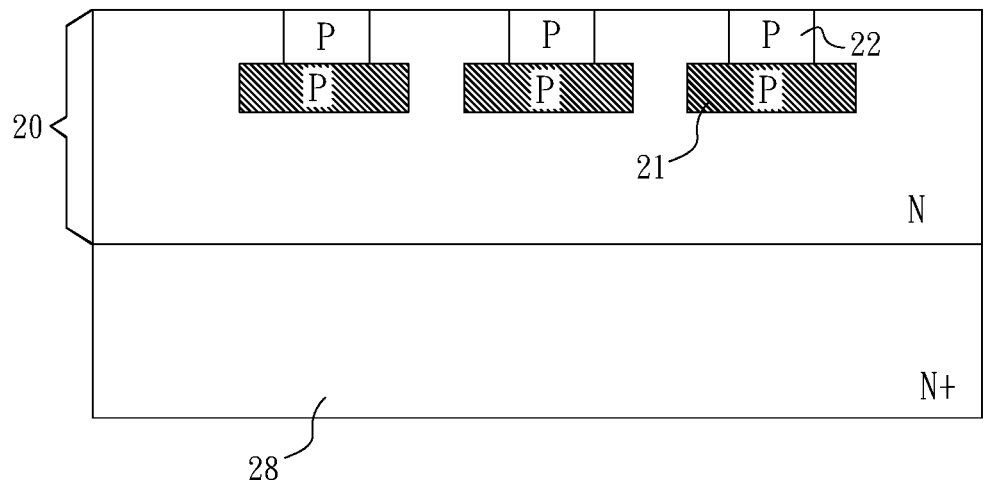
Figure 3D:
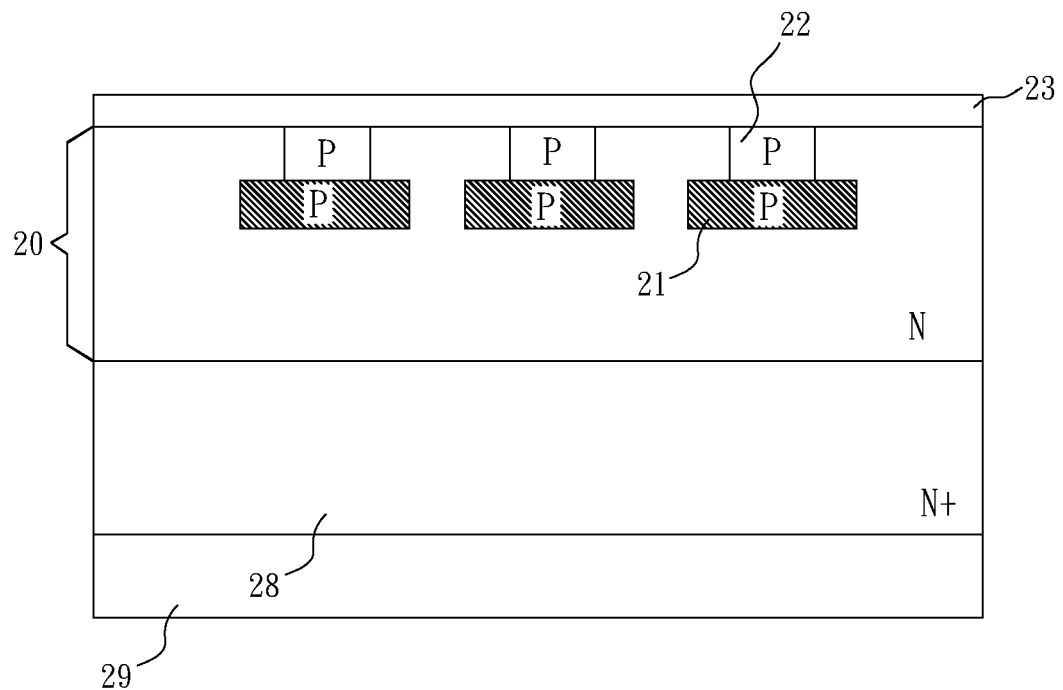

FIG. 2 is a diagram schematically illustrating a junction barrier Schottky diode device according to a first embodiment of the invention. Referring to FIG. 2, the junction barrier Schottky diode device 2 includes an N-type semiconductor layer 20, a plurality of first P-type doped areas 21, a plurality of second P-type doped areas 22, a conductive metal layer 23, an N-type heavily-doped substrate 28, and a metal layer 29. The N-type semiconductor layer 20, the first P-type doped areas 21, the second P-type doped areas 22, and the N-type heavily-doped substrate 28 include at least one of silicon carbide (SiC), gallium nitride (GaN), gallium oxide ($Ga_2O_3$) and silicon (Si). The N-type semiconductor layer 20 may be an N-type epitaxial layer or an N-type semiconductor substrate. The dopant concentration of the N-type semiconductor layer 20 which is called drift layer may be relatively low to keep the high break down voltage. The first P-type doped areas 21 and the second P-type doped areas 22 may be formed by ion implantation and subsequent high temperature anneal in order to activate the implanted impurities. The conductive metal layer 23 includes titanium or nickel. But the conductive metal layer 23 is not limited to titanium or nickel. The plurality of first P-type doped areas 21 and the plurality of second P-type doped areas 22 are formed in the N-type semiconductor layer 20. The plurality of second P-type doped areas 22 is self-alignedly formed above the plurality of first P-type doped areas 21. Specifically, the second P-type doped areas 22 are respectively formed above the first P-type doped areas 21. The second P-type doped areas 22 are respectively adjacent to the first P-type doped areas 21. There is nothing between the second P-type doped area 22 and the corresponding first P-type doped area 21. The spacing S2 between every neighboring two of the plurality of second P-type doped areas 22 is larger than the spacing S1 between every neighboring two of the plurality of first P-type doped areas 21. The width W1 of each of the plurality of first P-type doped areas 21 in cross section may be larger than the width W2 of each of the plurality of second P-type doped areas 22 in cross section. The conductive metal layer 23, formed on the N-type semiconductor layer 20, covers the plurality of first P-type doped areas 21, and the plurality of second P-type doped areas 22. Due to a fact that the spacing S2 is larger than the spacing S1, the junction barrier Schottky diode device 2 reduces the leakage current in a reverse bias condition and the forward voltage in a forward bias condition. If the N-type semiconductor layer 20 is an N-type epitaxial layer, the N-type semiconductor layer 20 is formed on the top of the N-type heavily-doped substrate 28. The N-type heavily-doped substrate 28 is used as an ohmic contact with back side metal 29. The metal layer 29 is formed on the bottom of the N-type heavily-doped substrate 28 and used for gluing junction barrier Schottky diode device 2 to a package structure or a module. FIGS. 3(a)-3(d) are diagrams schematically illustrating the step of fabricating junction barrier Schottky diode device according to the first embodiment of the invention. Referring to FIGS. 3(a)-3(d), the method for fabricating the junction barrier Schottky diode device 2 according to the first embodiment of the present invention is introduced as follows. As illustrated in FIG. 3(a), the N-type semiconductor layer 20 may be formed on the top of the N-type heavily-doped substrate 28. And a first mask 26 is formed on the N-type semiconductor layer 20, wherein the first mask 26 is penetrated with first openings 261. Then, the plurality of first P-type doped areas 21 are formed in the N-type semiconductor layer 20 through the first openings 261. As illustrated in FIG. 3(b), second masks 27 are respectively formed in the first openings 261, wherein each of the second masks 27 is penetrated with a second opening 271. Each of the second masks 27 has shapes of triangles in cross section, wherein the widths d of the triangles are equal. Then, the plurality of second P-type doped areas 22 are formed in the N-type semiconductor layer 20 through the second openings 271 of the second masks 27, wherein the plurality of second P-type doped areas 22 is self-alignedly formed above the plurality of first P-type doped areas 21, and the spacing S2 between every neighboring two of the plurality of second P-type doped areas 22 is larger than the spacing S1 between every neighboring two of the plurality of first P-type doped areas 21. As illustrated in FIG. 3(c), the first mask 26 and the second masks 27 are removed. The first mask 26 and the second masks 27 may include chemical vapor deposition (CVD) oxide or CVD polycrystalline silicon or CVD silicon nitride, but the present invention is not limited thereto. The first mask 26 and the second masks 27 may formed by CVD and etching back the CVD layer. The second masks 27 are formed as sidewall. Sidewall shape is not limited to triangle. As illustrated in FIG. 3(d), the conductive metal layer 23 is formed on the N-type semiconductor layer 20 to cover the plurality of first P-type doped areas 21 and the plurality of second P-type doped areas 22. The metal layer 29 may be formed on the bottom of the N-type heavily-doped substrate 28.

Figure 4:
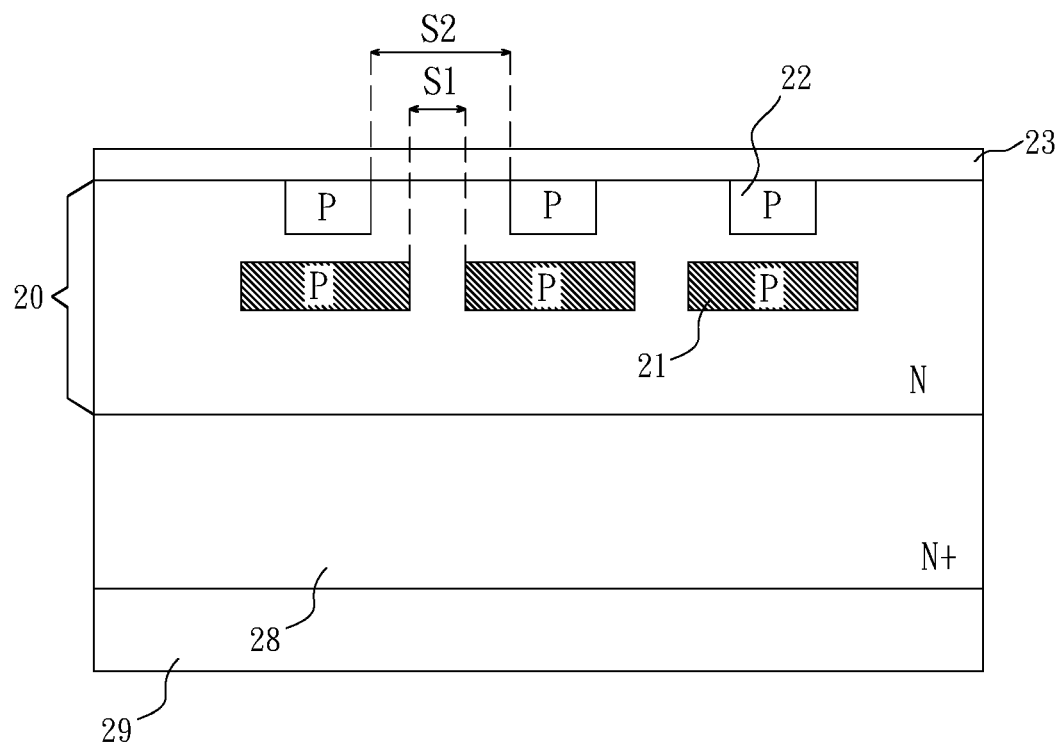
FIG. 4 is a diagram schematically illustrating a junction barrier Schottky diode device according to a second embodiment of the invention.
Figure 5A:
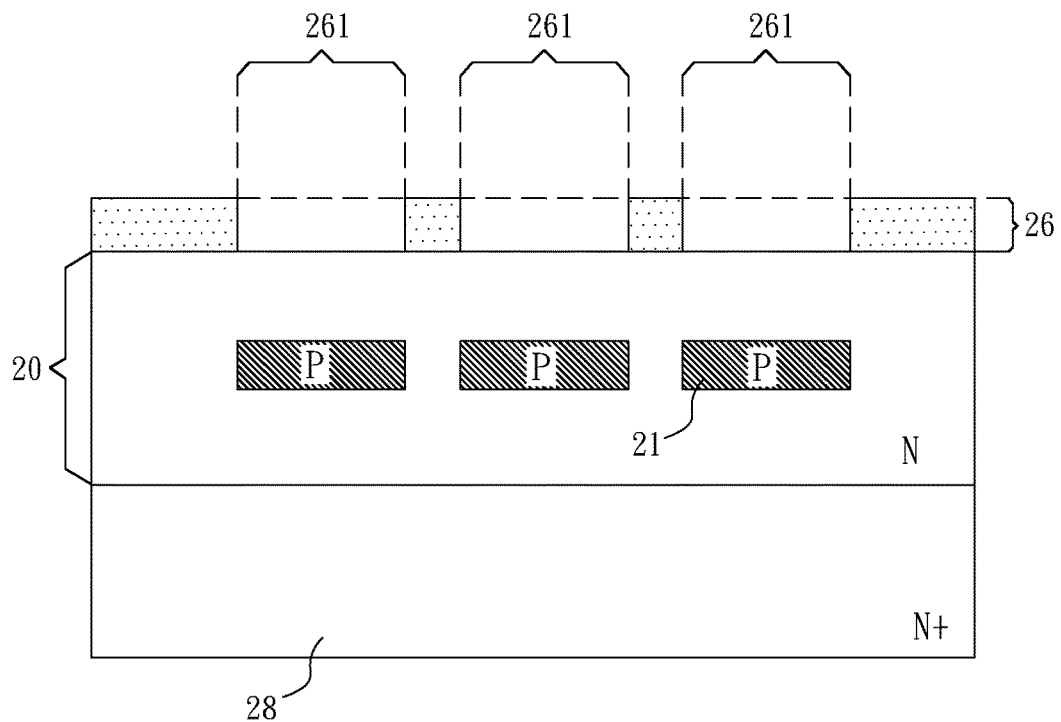
FIGS. 5(a)-5(d) are diagrams schematically illustrating the step of fabricating junction barrier Schottky diode device according to the second embodiment of the invention.
Figure 5B:
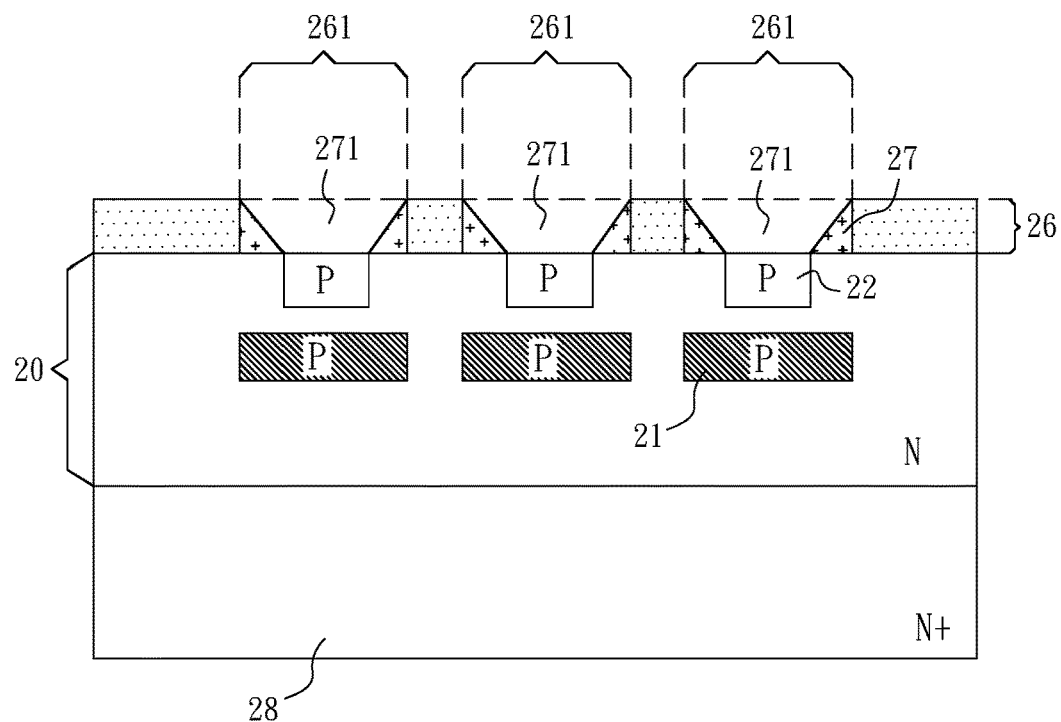
Figure 5C:
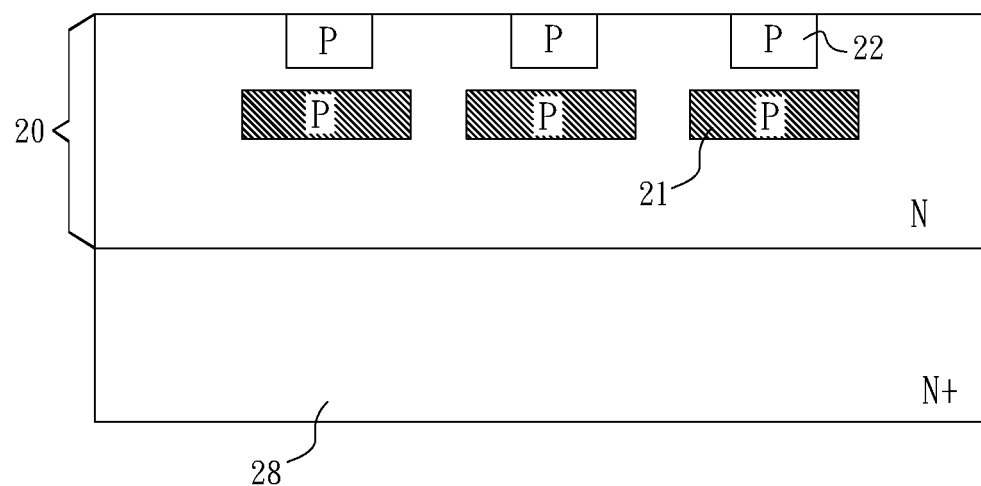
Figure 5D:
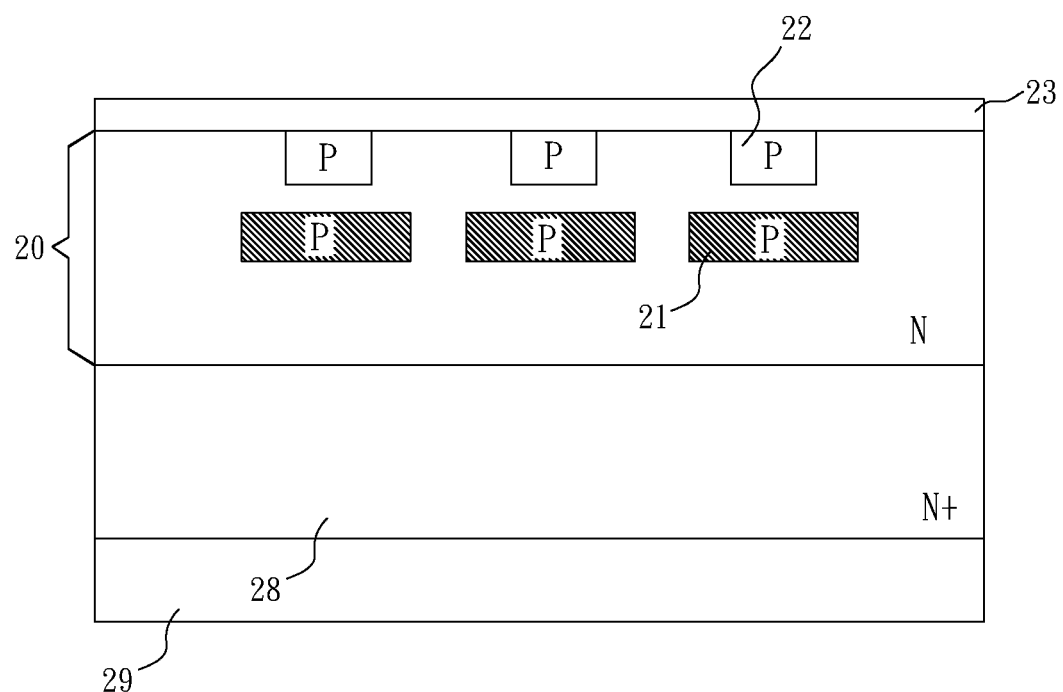

FIG. 4 is a diagram schematically illustrating a junction barrier Schottky diode device according to a second embodiment of the invention. Referring to FIG. 4, the second embodiment is introduced as follows. The second embodiment is different from the first embodiment in the position of the plurality of first P-type doped areas 21. In the second embodiment, the plurality of second P-type doped areas 22 respectively separates from the plurality of first P-type doped areas 21. The other features of the second embodiment are the same to those of the first embodiment so will not be reiterated.

FIGS. 5(a)-5(d) are diagrams schematically illustrating the step of fabricating junction barrier Schottky diode device according to the second embodiment of the invention. Referring to FIGS. 5(a)-5(d), the method for fabricating the junction barrier Schottky diode device 2 according to the second embodiment of the present invention is introduced as follows. The second embodiment is different from the first embodiment in the position of the plurality of first P-type doped areas 21. In the second embodiment, the plurality of second P-type doped areas 22 respectively separates from the plurality of first P-type doped areas 21. The other features of the second embodiment are the same to those of the first embodiment so will not be reiterated.

Figure 6:
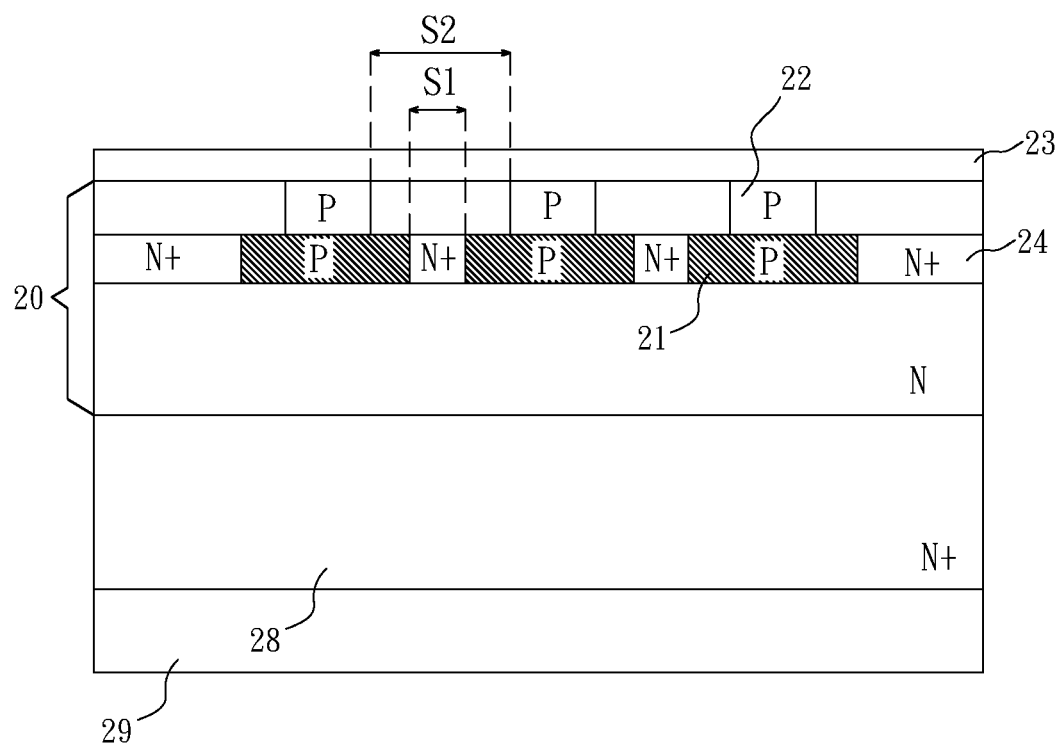
FIG. 6 is a diagram schematically illustrating a junction barrier Schottky diode device according to a third embodiment of the invention.

FIG. 6 is a diagram schematically illustrating a junction barrier Schottky diode device according to a third embodiment of the invention. Referring to FIG. 6, the junction barrier Schottky diode device 2 includes an N-type semiconductor layer 20, a plurality of first P-type doped areas 21, a plurality of second P-type doped areas 22, a conductive metal layer 23, and a plurality N-type heavily-doped areas 24. The doping concentration of the N-type heavily-doped area 24 is higher than that of the N-type semiconductor layer 20. The N-type semiconductor layer 20 may be an N-type epitaxial layer or an N-type semiconductor substrate. The conductive metal layer 23 includes but not limited to titanium or nickel. The plurality of first P-type doped areas 21 and the plurality of second P-type doped areas 22 are formed in the N-type semiconductor layer 20. The plurality of second P-type doped areas 22 is self-alignedly formed above the plurality of first P-type doped areas 21. Specifically, the second P-type doped areas 22 are respectively formed above the first P-type doped areas 21. The second P-type doped areas 22 are respectively adjacent to the first P-type doped areas 21. There is nothing between the second P-type doped area 22 and the corresponding first P-type doped area 21. The spacing S2 between every neighboring two of the plurality of second P-type doped areas 22 is larger than the spacing S1 between every neighboring two of the plurality of first P-type doped areas 21. The width of each of the plurality of first P-type doped areas 21 may be larger than the width of each of the plurality of second P-type doped areas 22. The plurality N-type heavily-doped areas 24 is formed in the N-type semiconductor layer 20. The plurality of first P-type doped areas 21 and the plurality N-type heavily-doped areas 24 are alternately positioned. The conductive metal layer 23, formed on the N-type semiconductor layer 20, covers the plurality of first P-type doped areas 21, the plurality of second P-type doped areas 22, and the plurality N-type heavily-doped areas 24. Due to a fact that the spacing S2 is larger than the spacing S1, the junction barrier Schottky diode device 2 reduces the leakage current in a reverse bias condition and the forward voltage in a forward bias condition. The plurality of N-type heavily-doped areas 24 are used to reduce the electric resistance of semiconductors between first P-type doped areas 21 and reduce forward voltage with maintaining proper breakdown voltage. If the N-type semiconductor layer 20 is an N-type epitaxial layer, the N-type semiconductor layer 20 is formed on the top of the N-type heavily-doped substrate 28. The N-type heavily-doped substrate 28 is used as an ohmic contact. The metal layer 29 is formed on the bottom of the N-type heavily-doped substrate 28 and used for gluing junction barrier Schottky diode device 2 to a package structure or a module.

Figure 7A:
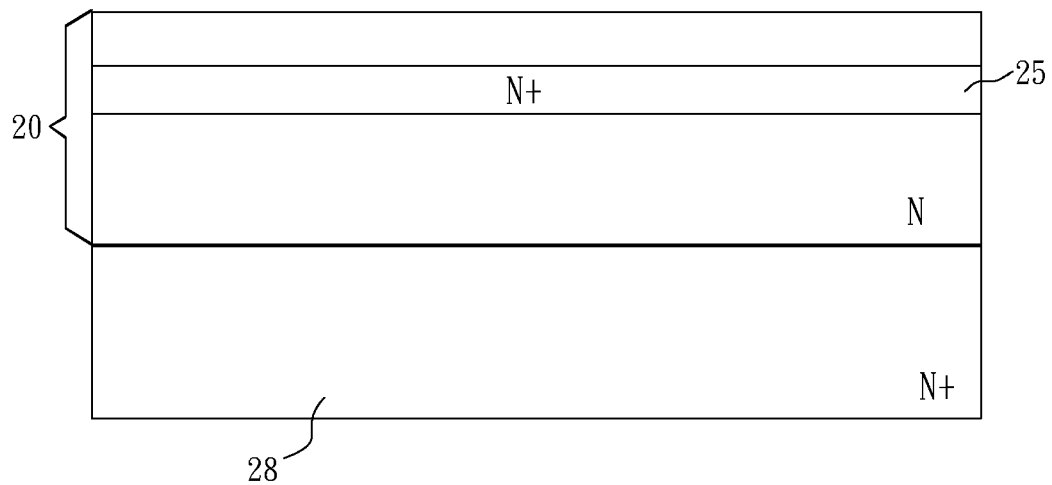
FIGS. 7(a)-7(e) are diagrams schematically illustrating the step of fabricating junction barrier Schottky diode device according to the third embodiment of the invention.
Figure 7B:
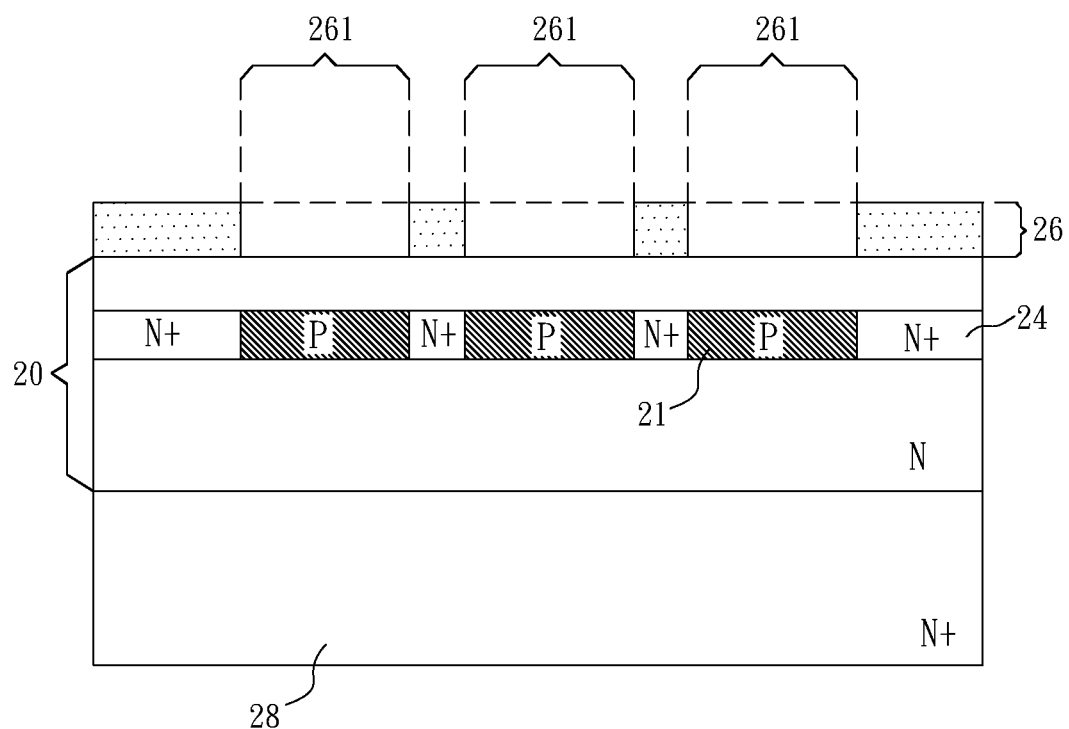
Figure 7C:
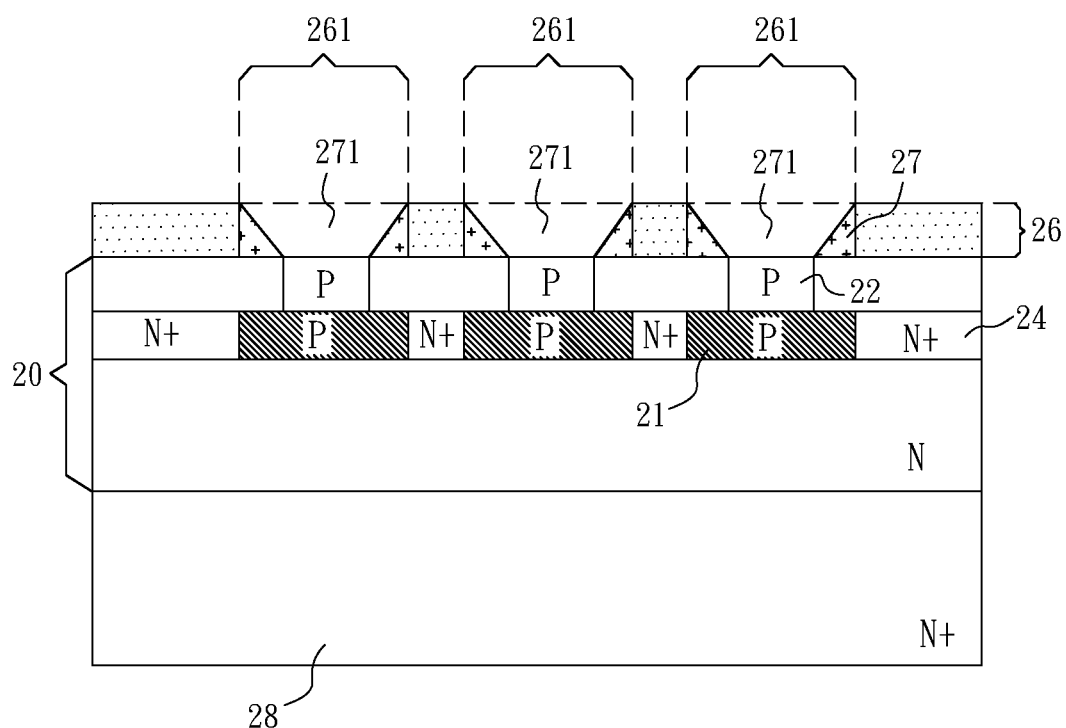
Figure 7D:
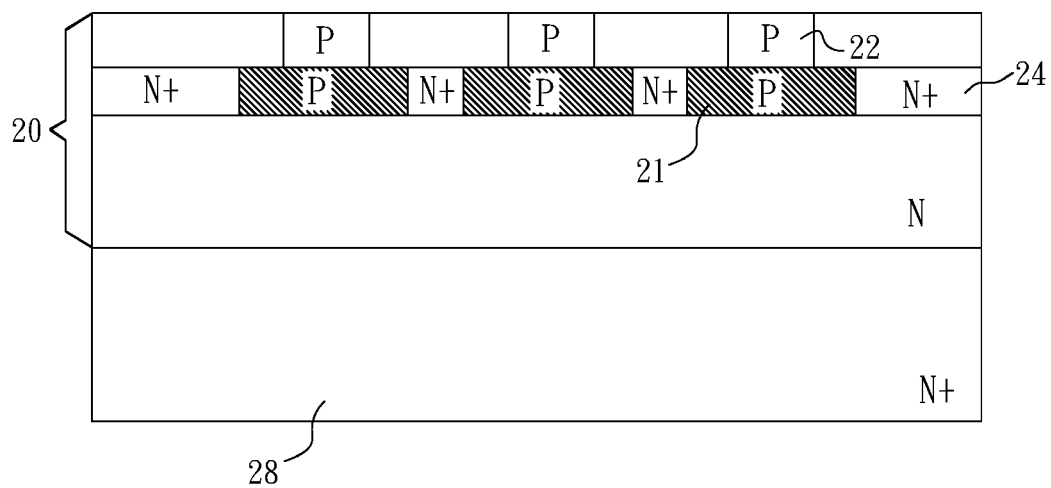
Figure 7E:
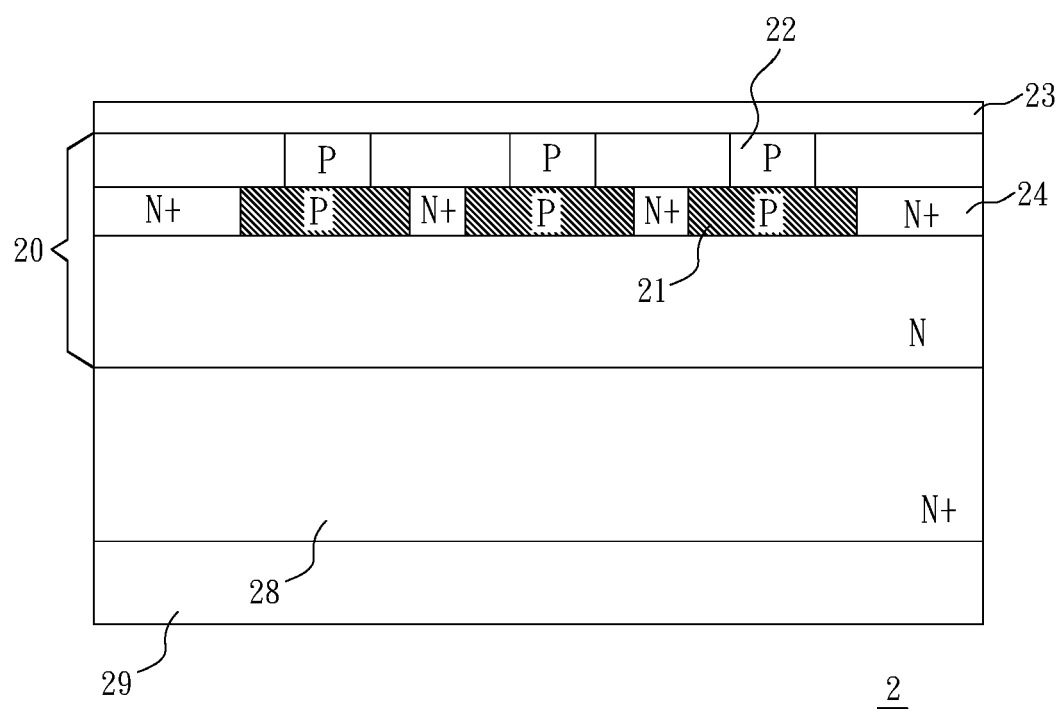

FIGS. 7(a)-7(e) are diagrams schematically illustrating the step of fabricating junction barrier Schottky diode device according to the third embodiment of the invention. Referring to FIGS. 7(a)-7(e), the method for fabricating the junction barrier Schottky diode device 2 according to the third embodiment of the present invention is introduced as follows. As illustrated in FIG. 7(a), an N-type heavily-doped layer 25 is formed in the N-type semiconductor layer 20. The N-type heavily-doped layer 25 may be formed in the N-type semiconductor layer 20 by ion implantation and high-temperature annealing later in order to activate the implanted impurities. Alternatively, the N-type heavily-doped layer 25 and the N-type semiconductor layer 20 are formed using the multiple epitaxial technology. The first N-type semiconductor layer 20 may be formed on the top of the N-type heavily-doped substrate 28 and the N-type heavily-doped layer 25 may be formed by epitaxial growth and second N-type semiconductor layer 20 may be formed on the top of the N-type heavily-doped layer 25. As illustrated in FIG. 7(b), a first mask 26 is formed on the N-type semiconductor layer 20, wherein the first mask 26 is penetrated with first openings 261. Then, the plurality of first P-type doped areas 21 are formed in the N-type heavily-doped layer 25 through the first openings 261 to form the plurality N-type heavily-doped areas 24 alternating with the plurality of first P-type doped areas 21. As illustrated in FIG. 7(c), second masks 27 are respectively formed in the first openings 261, wherein each of the second masks 27 is penetrated with a second opening 271. Then, the plurality of second P-type doped areas 22 are formed in the N-type semiconductor layer 20 through the second openings 271 of the second masks 27, wherein the plurality of second P-type doped areas 22 is self-alignedly formed above the plurality of first P-type doped areas 21, and the spacing S2 between every neighboring two of the plurality of second P-type doped areas 22 is larger than the spacing S1 between every neighboring two of the plurality of first P-type doped areas 21. As illustrated in FIG. 7(d), the first mask 26 and the second masks 27 are removed. The first mask 26 and the second masks 27 may include chemical vapor deposition (CVD) oxide, CVD polycrystalline silicon or CVD silicon nitride, but the present invention is not limited thereto. The first mask 26 and the second masks 27 may be formed by CVD and etching back the CVD layer. The second masks 27 are formed as sidewall. Sidewall shape is not limited to triangle. As illustrated in FIG. 7(e), the conductive metal layer 23 is formed on the N-type semiconductor layer 20 to cover the plurality of first P-type doped areas 21, the plurality of second P-type doped areas 22, and the plurality N-type heavily-doped areas 24. The metal layer 29 may be formed on the bottom of the N-type heavily-doped substrate 28.

Figure 8:
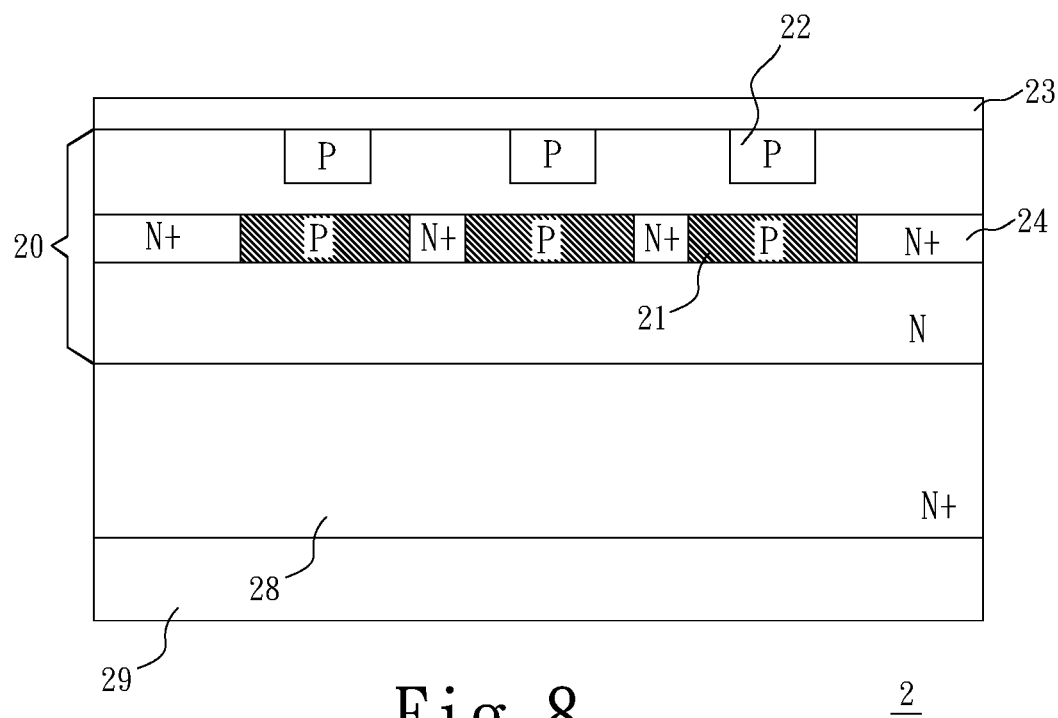
FIG. 8 is a diagram schematically illustrating a junction barrier Schottky diode device according to a fourth embodiment of the invention.
Figure 9A:
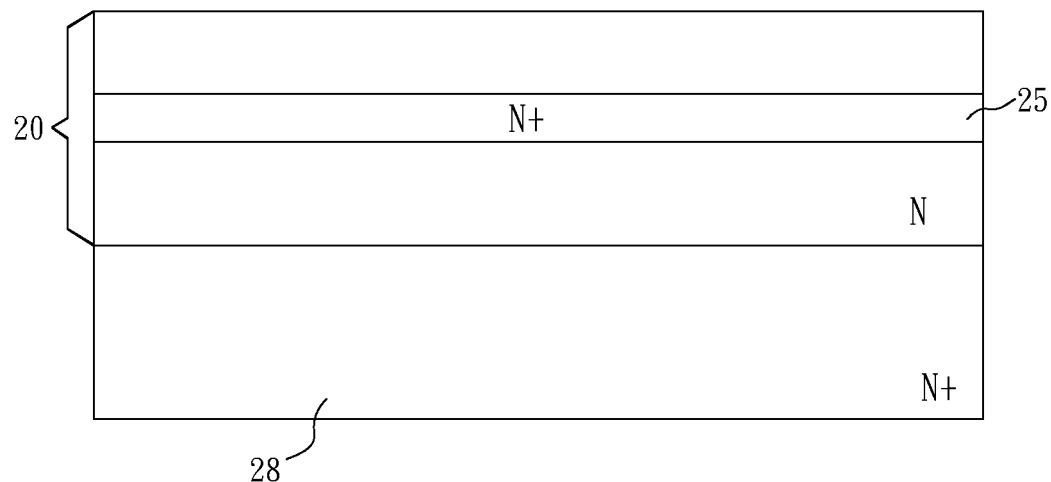
FIGS. 9(a)-9(e) are diagrams schematically illustrating the step of fabricating junction barrier Schottky diode device according to the fourth embodiment of the invention.
Figure 9B:
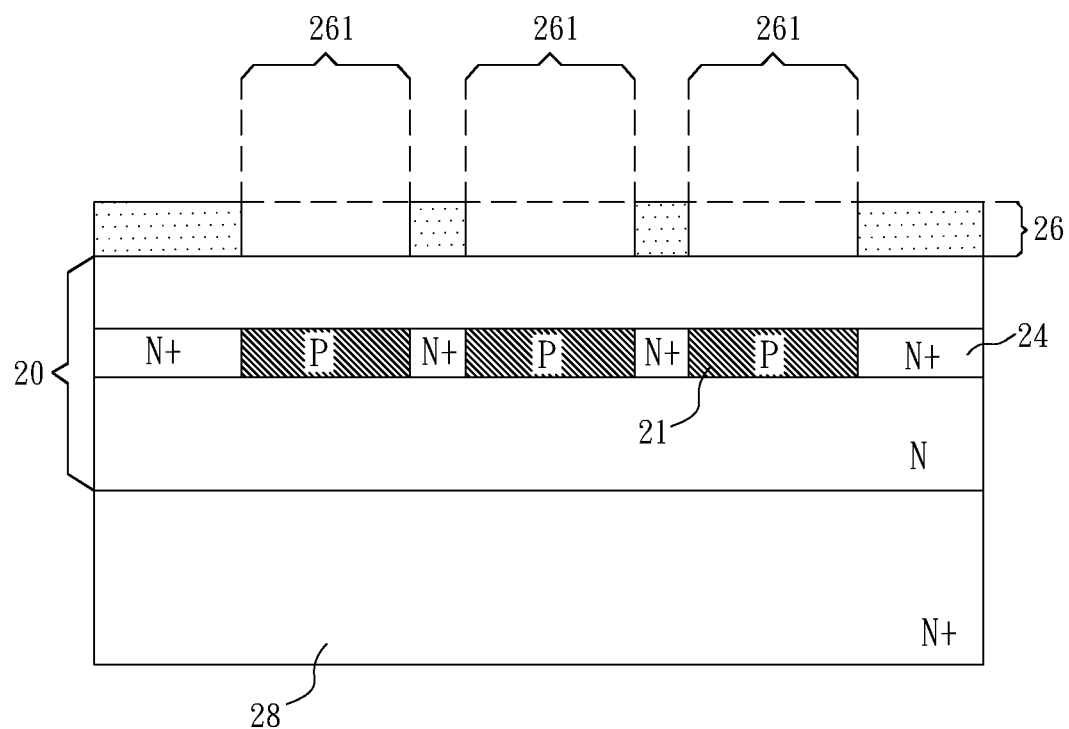
Figure 9C:
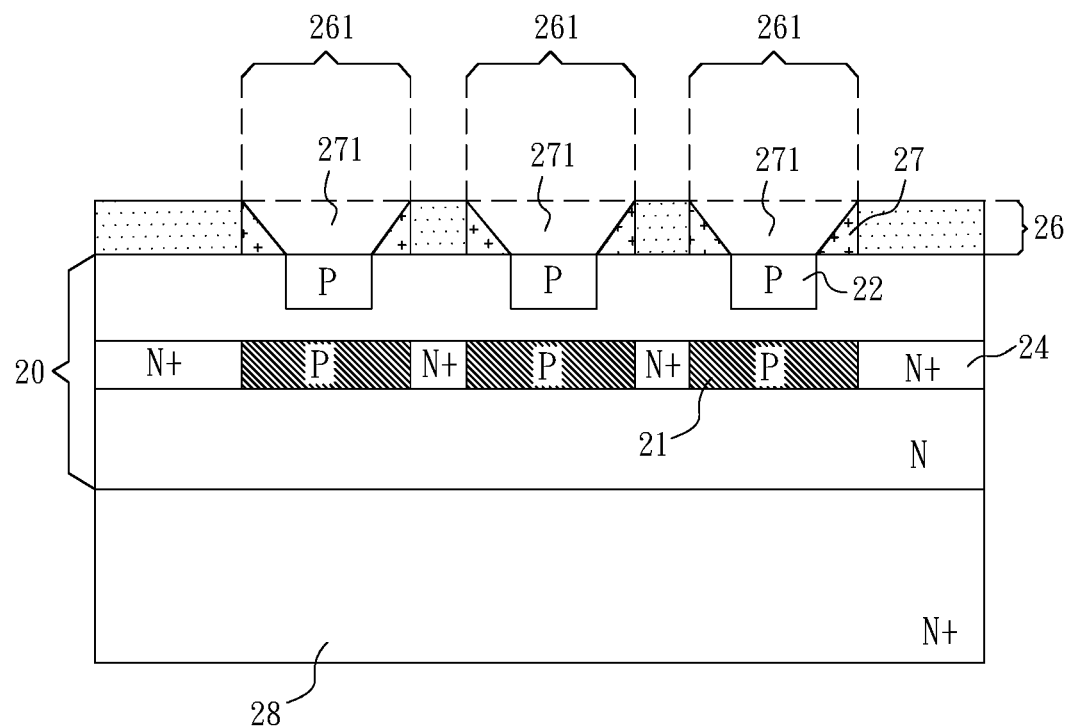
Figure 9D:
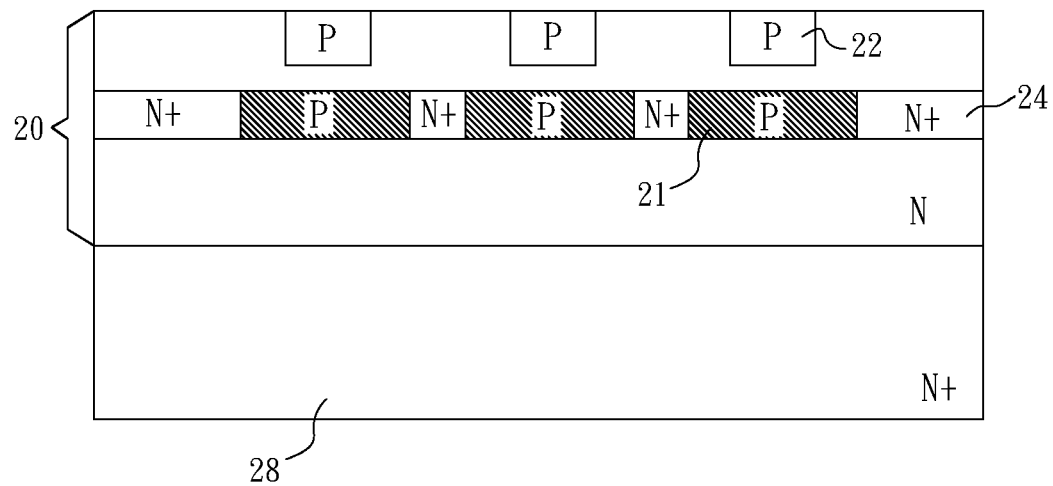
Figure 9E:
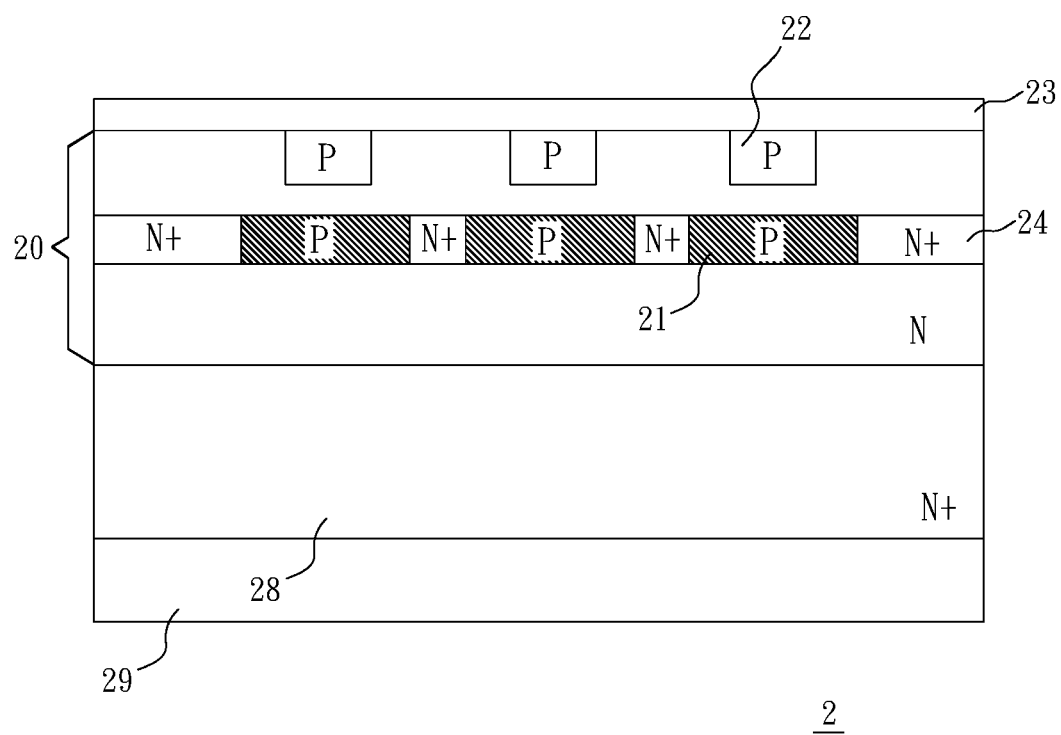

FIG. 8 is a diagram schematically illustrating a junction barrier Schottky diode device according to a fourth embodiment of the invention. Referring to FIG. 8, the fourth embodiment is introduced as follows. The fourth embodiment is different from the third embodiment in the position of the plurality of first P-type doped areas 21. In the fourth embodiment, the plurality of second P-type doped areas 22 respectively separates from the plurality of first P-type doped areas 21. The other features of the fourth embodiment are the same to those of the third embodiment so will not be reiterated.

FIGS. 9(a)-9(e) are diagrams schematically illustrating the step of fabricating junction barrier Schottky diode device according to the fourth embodiment of the invention. Referring to FIGS. 9(a)-9(e), the method for fabricating the junction barrier Schottky diode device 2 according to the fourth embodiment of the present invention is introduced as follows. The fourth embodiment is different from the third embodiment in the position of the plurality of first P-type doped areas 21. In the fourth embodiment, the plurality of second P-type doped areas 22 respectively separates from the plurality of first P-type doped areas 21. The other features of the fourth embodiment are the same to those of the third embodiment so will not be reiterated.

Figure 10:
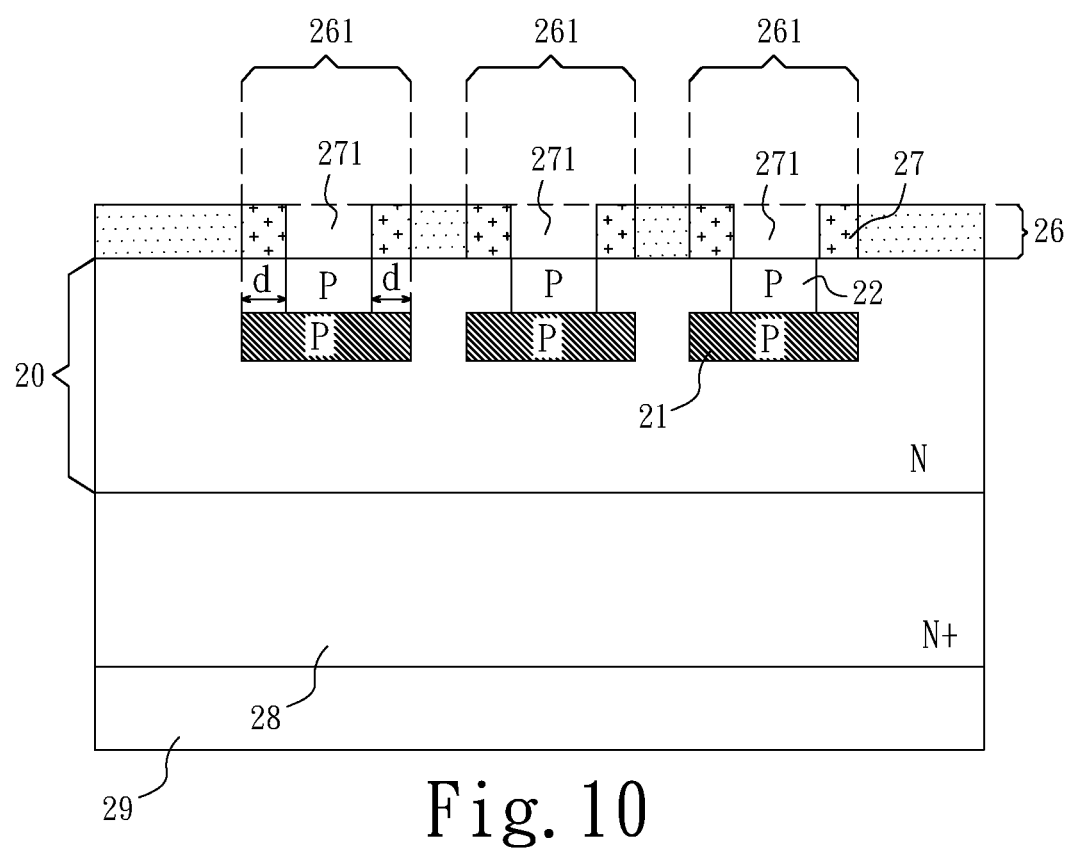
FIG. 10 is a diagram schematically illustrating the step of forming second P-type doped areas in an N-type semiconductor layer according to another embodiment of the invention.

FIG. 10 is a diagram schematically illustrating the step of forming second P-type doped areas in an N-type semiconductor layer according to another embodiment of the invention. Referring to FIG. 10, second masks 27 are respectively formed in the first openings 261, wherein each of the second masks 27 is penetrated with a second opening 271. Each of the second masks 27 has shapes of rectangles in cross section, wherein the widths d and d' of the rectangles are larger zero. The technology of FIG. 10 can be applied to the embodiments provided above.

Figure 11A:
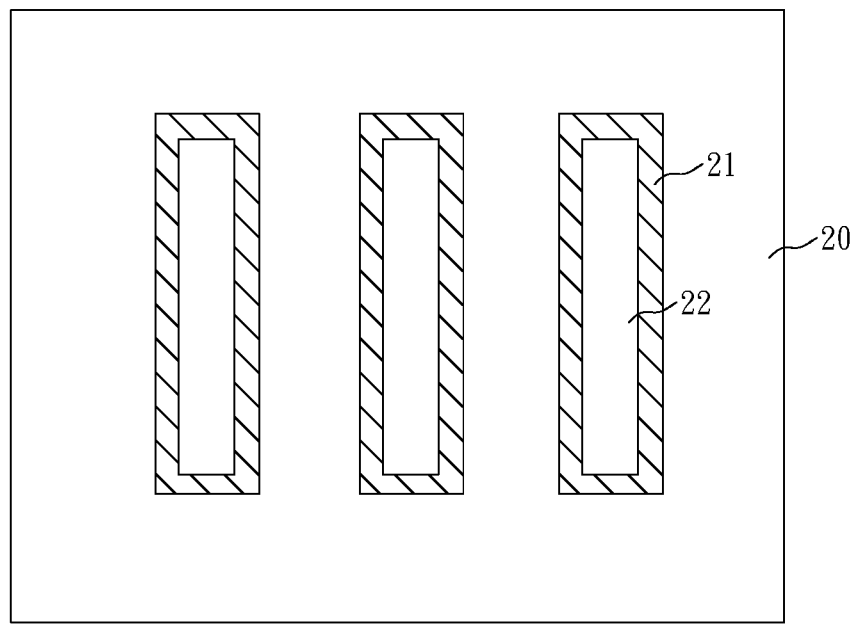
FIGS. 11(a)-11(d) are top views of an N-type semiconductor layer, a plurality of first P-type doped areas, and a plurality of second P-type doped areas according to various embodiments of the present invention.
Figure 11B:
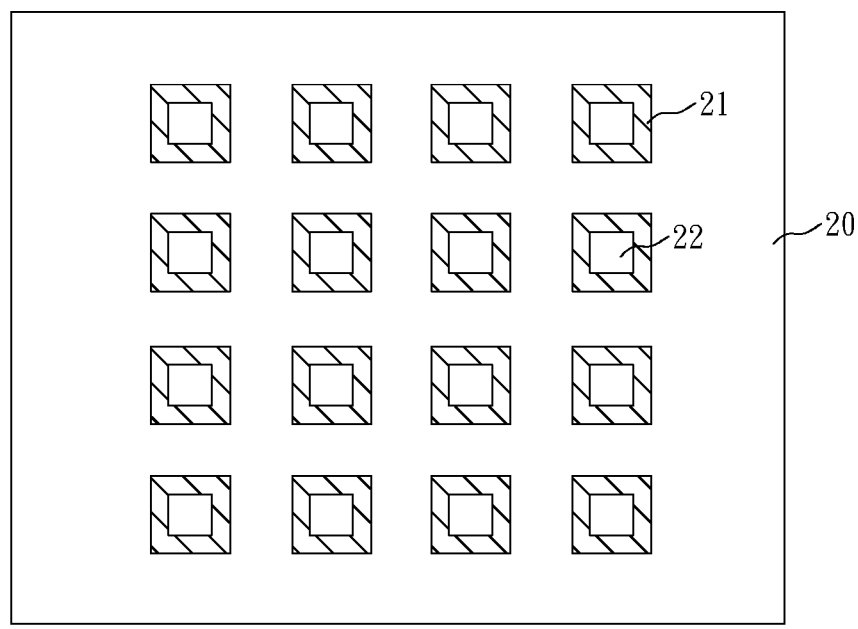
Figure 11C:
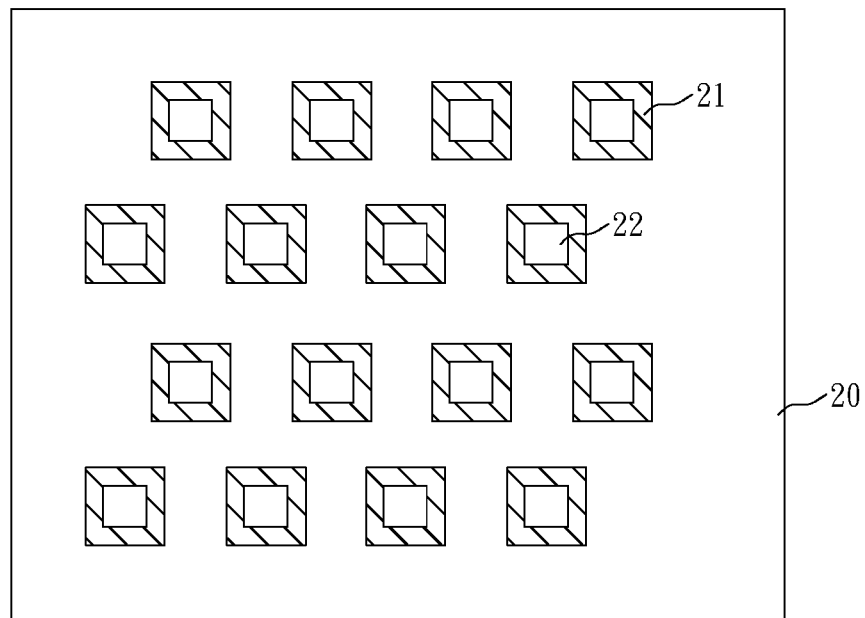

FIGS. 11(a)-11(d) are top views of an N-type semiconductor layer, a plurality of first P-type doped areas, and a plurality of second P-type doped areas according to various embodiments of the present invention. Referring to FIGS. 11(a)-11(d), the layouts of the N-type semiconductor layer 20, the plurality of first P-type doped areas 21, and the plurality of second P-type doped areas 22 according to various embodiments of the present invention are introduced as follows. As illustrated in FIG. 11(a), the plurality of first P-type doped areas 21 is stripe-shaped doped areas that are arranged in parallel, and the plurality of second P-type doped areas 22 is stripe-shaped doped areas that are arranged in parallel. As illustrated in FIG. 11(b), the plurality of first P-type doped areas 21 is regularly arranged, and the plurality of second P-type doped areas 22 is regularly arranged. In such a case, the plurality of first P-type doped areas 21 and the plurality of second P-type doped areas 22 are square-shaped or rectangular-shaped doped areas. As illustrated in FIG. 11(c), the plurality of first P-type doped areas 21 is arranged into an array with N rows and M columns. N and M are equal to or larger than 2. Two neighboring rows of the plurality of first P-type doped areas 21 are staggered from each other. Two neighboring columns of the plurality of first P-type doped areas 21 are staggered from each other. The plurality of second P-type doped areas 22 is arranged into an array with N' rows and M' columns. N' and M' are equal to or larger than 2. Two neighboring rows of the plurality of second P-type doped areas 22 are staggered from each other.

Figure 11D:
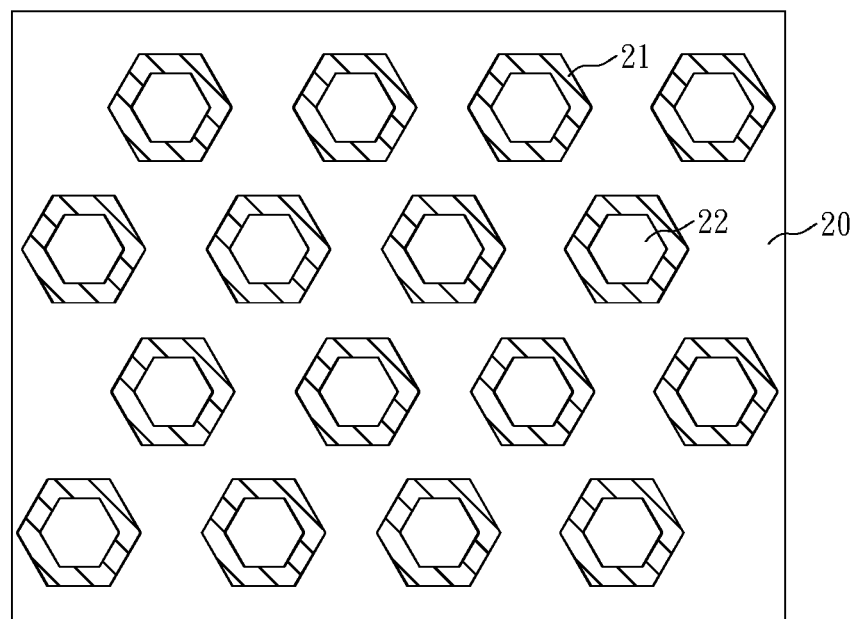

Two neighboring columns of the plurality of second P-type doped areas 22 are staggered from each other. In such a case, the plurality of first P-type doped areas 21 and the plurality of second P-type doped areas 22 are square-shaped or rectangular-shaped doped areas. As illustrated in FIG. 11(d), the plurality of first P-type doped areas 21 is arranged into an array with N rows and M columns. N and M are equal to or larger than 2. Two neighboring rows of the plurality of first P-type doped areas 21 are staggered from each other. Two neighboring columns of the plurality of first P-type doped areas 21 are staggered from each other. The plurality of second P-type doped areas 22 is arranged into an array with N' rows and M' columns. N' and M' are equal to or larger than 2. Two neighboring rows of the plurality of second P-type doped areas 22 are staggered from each other. Two neighboring columns of the plurality of second P-type doped areas 22 are staggered from each other. In such a case, the plurality of first P-type doped areas 21 and the plurality of second P-type doped areas 22 are hexagonal-shaped doped areas.

In FIG. 11(a), FIG. 11(b), FIG. 11(c) and FIG. 11(d), the outer first P-type doped areas 21 are usually connected to the termination structures. The termination structure may be field limiting rings or junction termination extension.

According to the embodiments provided above, the junction barrier Schottky diode device and the method for fabricating the same adjust the spacing between every neighboring two of the plurality of second P-type doped areas to be larger than the spacing between every neighboring two of the plurality of first P-type doped areas, thereby reducing the leakage current in a reverse bias condition and the forward voltage in a forward bias condition.

What is claimed is:
1. A junction barrier Schottky diode device comprising:
an N-type semiconductor layer;
a plurality of first P-type doped areas formed in the N-type semiconductor layer;
a plurality of second P-type doped areas formed in the N-type semiconductor layer and self-alignedly formed above the plurality of first P-type doped areas, wherein spacing between every neighboring two of the plurality of second P-type doped areas is larger than spacing between every neighboring two of the plurality of first P-type doped areas;
a conductive metal layer, formed on the N-type semiconductor layer, covering the plurality of first P-type doped areas and the plurality of second P-type doped areas; and
a plurality of N-type heavily-doped areas formed in the N-type semiconductor layer, and the plurality of first P-type doped areas and the plurality N-type heavily-doped areas are alternately positioned.
2. The junction barrier Schottky diode device according to claim 1, wherein a width of each of the plurality of first P-type doped areas is larger than a width of each of the plurality of second P-type doped areas.

3. The junction barrier Schottky diode device according to claim 1, wherein the plurality of second P-type doped areas is respectively adjacent to the plurality of first P-type doped areas.

4. The junction barrier Schottky diode device according to claim 1, wherein the plurality of second P-type doped areas respectively separates from the plurality of first P-type doped areas.

5. The junction barrier Schottky diode device according to claim 1, wherein the plurality of first P-type doped areas is stripe-shaped doped areas that are arranged in parallel, and the plurality of second P-type doped areas is stripe-shaped doped areas that are arranged in parallel.

6. The junction barrier Schottky diode device according to claim 1, wherein the plurality of first P-type doped areas is square-shaped or rectangular-shaped and regularly arranged, and the plurality of second P-type doped areas is square-shaped or rectangular-shaped and regularly arranged.

7. The junction barrier Schottky diode device according to claim 1, wherein the plurality of first P-type doped areas is square-shaped or rectangular-shaped and arranged into an array with N rows and M columns, N and M are equal to or larger than 2, two neighboring rows of the plurality of first P-type doped areas are staggered from each other, two neighboring columns of the plurality of first P-type doped areas are staggered from each other, the plurality of second P-type doped areas is square-shaped or rectangular-shaped and arranged into an array with N' rows and M' columns, N' and M' are equal to or larger than 2, two neighboring rows of the plurality of second P-type doped areas are staggered from each other, and two neighboring columns of the plurality of second P-type doped areas are staggered from each other.

8. The junction barrier Schottky diode device according to claim 7, wherein the plurality of first P-type doped areas and the plurality of second P-type doped areas are hexagonal-shaped doped areas.

9. The junction barrier Schottky diode device according to claim 1, wherein the conductive metal layer comprises titanium or nickel.

10. The junction barrier Schottky diode device according to claim 1, wherein the N-type semiconductor layer is an N-type epitaxial layer or an N-type semiconductor substrate.

11. The junction barrier Schottky diode device according to claim 1, wherein the N-type semiconductor layer, the plurality of first P-type doped areas, and the plurality of second P-type doped areas comprise at least one of silicon carbide (SiC), gallium nitride (GaN), gallium oxide ($Ga_2O_3$) and silicon (Si).

* * * * *